(12) United States Patent
Iwanaga et al.

(10) Patent No.: US 7,611,780 B2
(45) Date of Patent: Nov. 3, 2009

(54) LIGHTING DEVICE, IMAGE PICKUP APPARATUS AND PORTABLE TERMINAL UNIT

(75) Inventors: Hiroki Iwanaga, Yokohama (JP); Akio Amano, Kawasaki (JP); Kenji Shimomura, Kawasaki (JP); Kazuaki Otsuka, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 422 days.

(21) Appl. No.: 11/348,412

(22) Filed: Feb. 7, 2006

(65) Prior Publication Data

US 2006/0214578 A1 Sep. 28, 2006

(30) Foreign Application Priority Data

Mar. 28, 2005 (JP) ............................. 2005-092289

(51) Int. Cl.
 *B32B 9/00* (2006.01)
(52) U.S. Cl. .......................... 428/690; 345/83; 257/100
(58) Field of Classification Search ................ 257/100; 345/83; 428/690; 252/301.16
See application file for complete search history.

(56) References Cited

U.S. PATENT DOCUMENTS 6,600,175 B1 * 7/2003 Baretz et al. ................ 257/100

2004/0196643 A1 * 10/2004 Terada et al. .................... 362/3
2004/0265631 A1 * 12/2004 Iwanaga et al. ............. 428/690
2005/0200796 A1   9/2005 Iwanaga et al.

FOREIGN PATENT DOCUMENTS

| JP | 2000031531 A | * | 1/2000 |
| JP | 2001-354953 |   | 12/2001 |
| JP | 2004-71807 |   | 3/2004 |

OTHER PUBLICATIONS

English Translation of JP2000-031531A.*
Yasuchika Hasegawa, et al., "Enhanced Luminescence of Lanthanide(III) Complexes in Polymer Matrices", Chemistry Letters 1999, pp. 35-36.

* cited by examiner

*Primary Examiner*—Nimeshkumar D. Patel
*Assistant Examiner*—Mary Ellen Bowman
(74) *Attorney, Agent, or Firm*—Oblon, Spivak, McClelland, Maier & Neustadt, L.L.P.

(57) ABSTRACT

A lighting device including a supporting member, a light emitting element disposed on the supporting member, and emitting light from an upper and side surfaces thereof, a first fluorescent layer containing an organic phosphor and disposed on the supporting member, and a second fluorescent layer containing only an inorganic phosphor and disposed on the supporting member, wherein the second fluorescent layer is disposed to cover the upper and side surfaces of the light emitting element, and the first fluorescent layer is disposed on at least side surface of the light emitting element with the second fluorescent layer being interposed between the light emitting element and the first fluorescent layer.

19 Claims, 4 Drawing Sheets

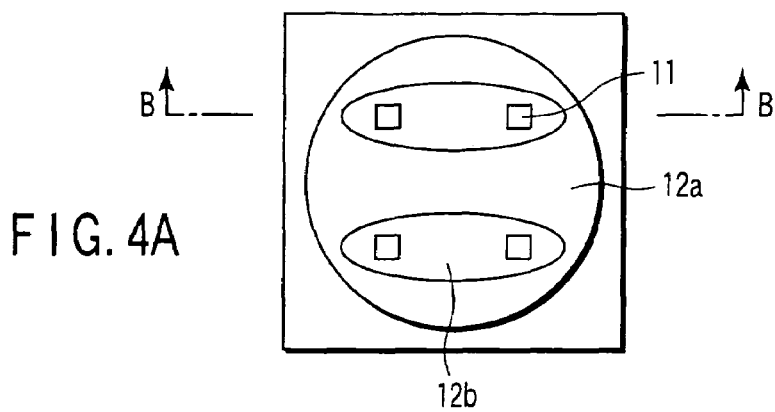
F I G. 4A
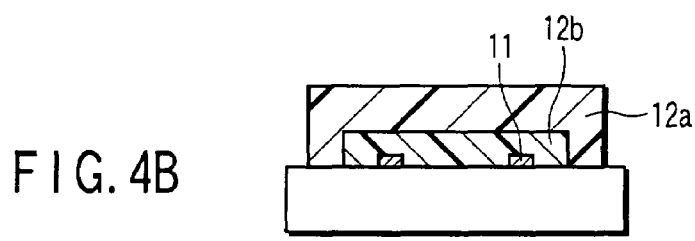
F I G. 4B
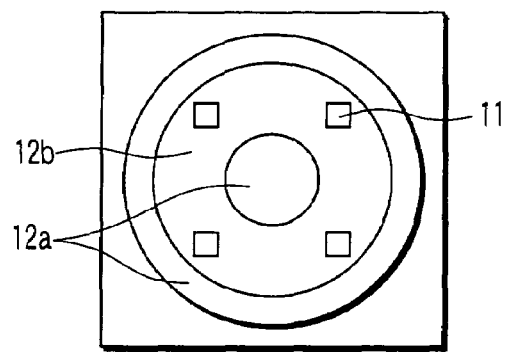
F I G. 5
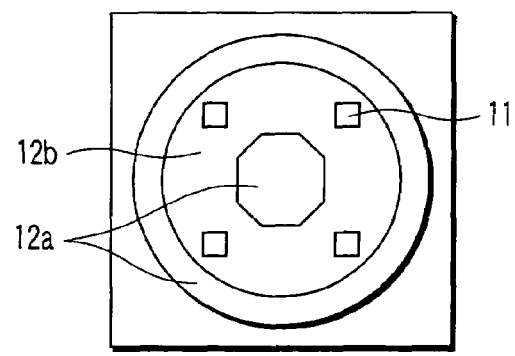
F I G. 6
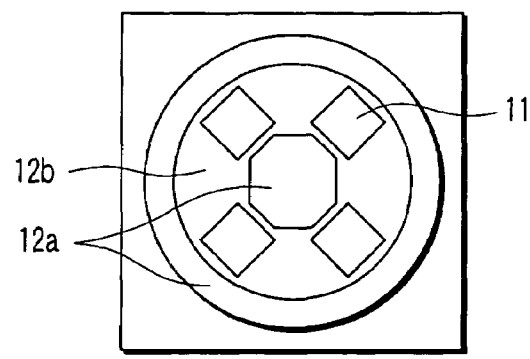
F I G. 7

LIGHTING DEVICE, IMAGE PICKUP APPARATUS AND PORTABLE TERMINAL UNIT

CROSS-REFERENCE TO RELATED APPLICATIONS

This application is based upon and claims the benefit of priority from prior Japanese Patent Application No. 2005-092289, filed Mar. 28, 2005, the entire contents of which are incorporated herein by reference.

BACKGROUND OF THE INVENTION

1. Field of the Invention

This invention relates to a lighting device utilizing an LED device, an image pickup apparatus equipped with the lighting device, and a portable terminal unit equipped with the image pickup apparatus.

2. Description of the Related Art

Some of the latest portable telephones are integrally equipped with a camera. However, the camera mounted on such portable telephones is not suited for use in taking a photograph of a clear image especially when a subject is dark. Further, the image photographed by the camera is poor in clearness in red, and there is a problem, when the subject photographed is a human figure, that the picture quality of yellowish-pink becomes poor. The quality of these characteristics depends largely on the brightness of flashlight emitted from the flashing device mounted on the portable telephones and on the performances such as color rendering properties, etc.

The flashing device to be mounted on the latest portable telephones can be generally classified into two types. One of them is based on a system where a plurality of white LED devices, each formed of a combination of a blue light emitting diode and a phosphor, are employed. In the case of this system, although it is possible to secure brightness from an LED device which is higher than a predetermined level, there are problems that the color rendering properties thereof are poor and the image photographed is poor in clearness. Especially, as described above, when a human figure is photographed, the yellowish-pink thereof becomes poor.

The other type is based on a system where white color is obtained through a combination of red (R)-, green(G)- and blue(B)-emitting diodes. In the case of this system, although it is possible to realize a flash having excellent color rendering properties, there are problems that since it is required to concurrently drive a plurality of light emitting diode chips differing in characteristics from each other, the control circuit thereof becomes complicated, thus making it difficult to realize the miniaturization of the device and to reduce the manufacturing cost thereof.

In addition to the aforementioned systems, there have been also proposed various kinds of systems such as a system wherein an ultraviolet light emitting diode chip and a red light emitting diode chip are combined (see for example, JP Laid-open Patent Publication (Kokai) No. 2004-71807), etc. However, even with these systems, it is difficult to overcome both problems of aforementioned brightness and the driving of light emitting diode chips.

There is also known a method wherein a white LED is prepared through a combination of ultraviolet-, near-ultraviolet- or bluish violet-emitting diode and a phosphor, and the resultant white LED is used for preparing a flashing device. However, since it is impossible to sufficiently excite a red phosphor by making use of the light of wavelength which these light emitting diodes emit, there is also a problem that the intensity of the red component in the spectrum will be weak.

BRIEF SUMMARY OF THE INVENTION

An object of the present invention is to provide a lighting device which is excellent in brightness and color rendering properties.

Another object of the present invention is to provide an image pickup apparatus which makes use of the lighting device, which is capable of obtaining a clear image even if the subject of the image is located far away and which is also suited for taking a photograph of a human figure.

A further object of the present invention is to provide a portable apparatus equipped with the aforementioned image pickup apparatus.

According to a first aspect of the present invention, there is provided a lighting device comprising a supporting member, a light emitting element disposed on the supporting member, and emitting light from an upper and side surfaces thereof, a first fluorescent layer containing an organic phosphor and disposed on the supporting member, and a second fluorescent layer containing only an inorganic phosphor and disposed on the supporting member, wherein the second fluorescent layer is disposed to cover the upper and side surfaces of the light emitting element, and the first fluorescent layer is disposed on at least side surface of the light emitting element with the second fluorescent layer being interposed between the light emitting element and the first fluorescent layer.

According to a second aspect of the present invention, there is provided an image pickup apparatus integrally equipped with the aforementioned lighting device as illumination on an occasion of taking a photograph.

According to a third aspect of the present invention, there is provided a portable terminal unit integrally equipped with the aforementioned image pickup apparatus.

BRIEF DESCRIPTION OF THE SEVERAL VIEWS OF THE DRAWING

FIGS. 4A and 4B are a top plan view and a cross-sectional view taken along the line B-B of FIG. 4A, respectively, both illustrating the lighting device according to a second embodiment of the present invention;

FIG. 5 is a top plan view illustrating a lighting device according to a third embodiment of the present invention;

FIG. 6 is a top plan view illustrating a lighting device according to a fourth embodiment of the present invention;

FIG. 7 is a top plan view illustrating a lighting device according to a fifth embodiment of the present invention;

DETAILED DESCRIPTION OF THE INVENTION

Figure 1:
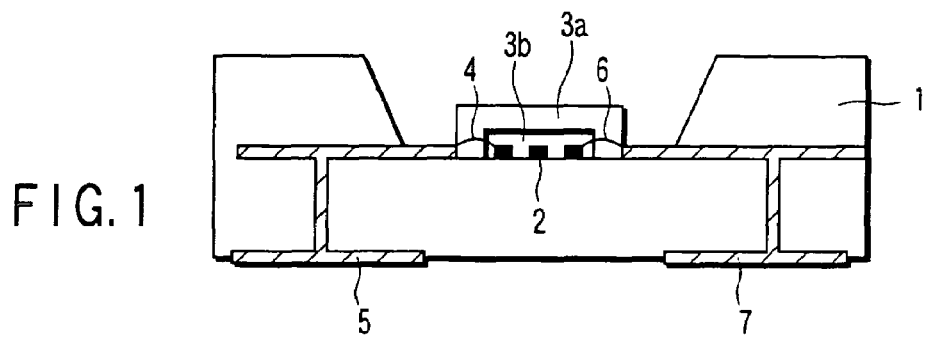
FIG. 1 is a cross-sectional view showing a general structure of a lighting device where an LED chip is employed as a light emitting source.

The lighting device according to a first aspect of the present invention comprises a supporting member, a light emitting element disposed on the supporting member, a first fluorescent layer containing an organic phosphor and disposed on the supporting member, and a second fluorescent layer containing only an inorganic phosphor and disposed on the supporting member. The second fluorescent layer is disposed to cover the light emitting surface of the light emitting element, and the first fluorescent layer is disposed at least on a side light emitting surface of the light emitting element with the second fluorescent layer being interposed therebetween.

In this lighting device, the first fluorescent layer and the second fluorescent layer can be variously arranged in relation to the light emitting element as described below.

1) A plurality of light emitting elements are disposed on the supporting member, the second fluorescent layer includes one regions which are disposed to cover a top and side surfaces of the plurality of light emitting elements, and the first fluorescent layer is disposed between the plurality of light emitting elements.

2) A plurality of light emitting elements are disposed on the supporting member, the second fluorescent layer includes a plurality of regions which are disposed to cover a top and side surfaces of the plurality of light emitting elements, and the first fluorescent layer is disposed between the plurality of light emitting elements.

3) A plurality of light emitting elements are disposed on the supporting member, the second fluorescent layer includes a plurality of regions which are separated away from each other covering a top and side surfaces of the plurality of light emitting elements, and the first fluorescent layer is disposed to cover a region between the plurality of regions of the second fluorescent layer.

4) A plurality of light emitting elements are disposed in an annular pattern on the supporting member, the second fluorescent layer is an annular film disposed to cover the annular pattern of the light emitting element, and the first fluorescent layer is disposed to cover at least a region inside the annular pattern and the top surface of the plurality of light emitting elements.

5) A plurality of light emitting elements are disposed in an annular pattern on the supporting member, the second fluorescent layer is an annular film disposed to cover the annular pattern of the light emitting element, and the first fluorescent layer is disposed to cover at least regions inside and outside the annular pattern and the top surface of the plurality of light emitting elements.

6) A plurality of light emitting elements are approximately rectangular in configuration respectively and disposed in an annular pattern, each light emitting side surface of the plurality of light emitting elements being directed to face a center of the annular pattern.

In the lighting device according to the first aspect of the present invention, a plurality of light emitting elements are all capable of emitting one kind of light selected from ultraviolet ray, near ultraviolet ray, bluish violet light and blue light, and all of the light emitting elements are designed to be driven by a single power source.

As for the organic phosphor to be included in the first fluorescent layer, it is possible to employ one which is capable of emitting red light. Further, as for the organic phosphor, it is possible to employ a trivalent europium complex.

In particular, the organic phosphor may be a red phosphor formed of a trivalent europium complex containing, as a ligand, at least one kind of β-diketone and at least one kind of phosphine oxide.

This europium complex may have a structure represented by the following formula (1).

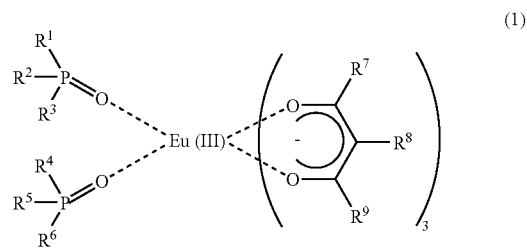

(1)

(wherein $R^1$-$R^9$ are individually selected from the group consisting of a linear or branched alkyl or alkoxy group each having not more than 20 carbon atoms, a phenyl group, biphenyl group, naphthyl group, heterocyclic group, substitution products of foregoing groups, a hydrogen atom and deuterium atom with a proviso that all of $R^1$-$R^6$ are not the same as each other; and n is an integer of 2 or more).

Alternatively, the europium complex may be coordinated with two different kinds of phosphine oxide structure.

This europium complex may comprise a structure represented by the following formula (2):

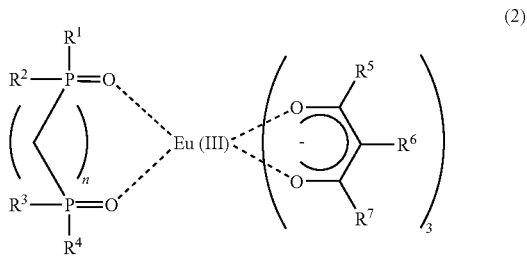

(2)

(wherein $R^1$-$R^7$ are individually selected from the group consisting of a linear or branched alkyl or alkoxy group each having not more than 20 carbon atoms, a phenyl group, biphenyl group, naphthyl group, heterocyclic group, substitution products of foregoing groups, a hydrogen atom and deuterium atom with a proviso that all of $R^1$-$R^4$ are not the same as each other; and n is an integer of 2 or more).

According to the first aspect of the present invention, since the first fluorescent layer containing an organic phosphor is disposed at least on a side surface of the light emitting element with the second fluorescent layer being interposed therebetween, the organic phosphor can be prevented from being deteriorated and the emission of light from the light emitting element is enabled to have a fairly large intensity of light even on the side surface(s) of the light emitting element, so that it is possible to obtain a high luminous intensity. As a result, it is possible to provide a lighting device which is high in luminous intensity and long in lifetime.

In particular, when a red phosphor comprising a trivalent europium complex is employed as an organic phosphor, it is possible to obtain a lighting device which is high in the spectrum intensity of red and excellent in color rendering properties.

Next, the best mode for carrying out the present invention will be explained.

FIG. 1 shows a general structure of a lighting device where an LED chip is employed as a light emitting source. As shown in FIG. 1, this lighting device comprises, for example, a plurality of LED chips 2 formed on the bottom surface of recessed portion of a substrate 1, the top of this recessed portion being opened. These LED chips 2 are covered by a second fluorescent layer 3b, which is, in turn, covered by a first fluorescent layer 3a. The upper electrode of each of the LED chips 2 is connected, via a first wire 4, with a first electrode 5. The lower electrode of each of the LED chips 2 is connected, via a second wire 6, with a second electrode 7.

The fluorescent layers 3a and 3b comprise particles of phosphor which are dispersed in a polymer matrix, wherein the first fluorescent layer 3a contains an organic phosphor and the second fluorescent layer 3b contains only an inorganic phosphor. The LED chips 2 are constituted by a GaN-based semiconductor material for example. It is possible to employ, as a light emitting element in place of an LED chip, a laser diode for instance which is capable of emitting a light of similar wavelength.

The lighting device constructed as shown in FIG. 1 is designed to be operated based on the principle that electric energy can be directly converted into optical energy by the effects of the LED chips 2 and the resultant light is converted by the phosphors included in the fluorescent layers 3a and 3b into a light having a different wavelength, thus emitting a predetermined light.

In the lighting device according to one embodiment of the present invention shown in FIG. 1, while the second fluorescent layer containing only an inorganic phosphor is disposed to cover the light emitting surface of the light emitting elements, the first phosphor layer is disposed on top and side surfaces of light emitting elements with the second fluorescent layer being interposed therebetween, i.e. without enabling the first phosphor to be directly contacted with the light emitting elements.

The intensity of emission by the phosphors is highest in the vicinity of the LED chips 2 but will be weakened sharply as it goes far away from the LED chips 2. In view of this fact, the phosphors should be accumulated close to the LED chips. However, when an organic phosphor is disposed in contact with the LED chips, the catalytic deterioration of the organic phosphor is promoted at the interface between an inorganic material and an organic material due to the concentration of heat and light, thereby making it difficult to secure a sufficient lifetime of the light emitting elements.

Figure 2:
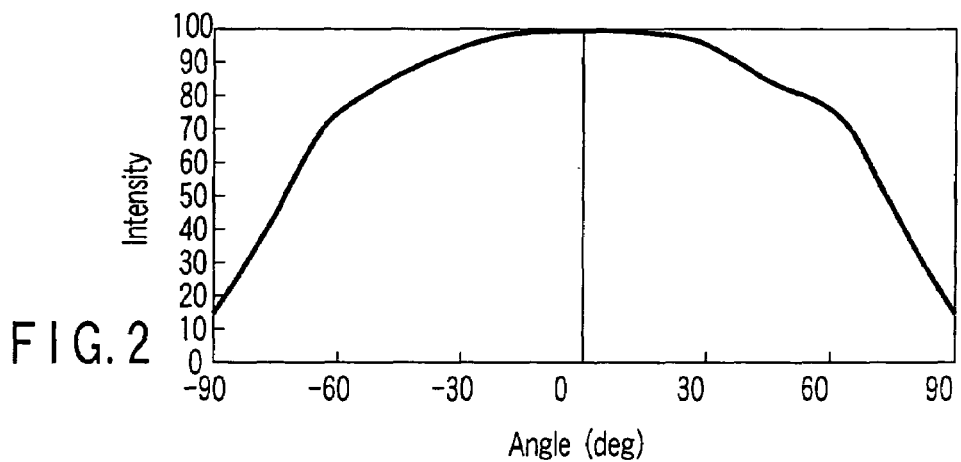
FIG. 2 is a graph illustrating the orientation of a light emitting element.

On the other hand, it has been conventionally considered that the directivity of emission from the LED chips is mostly consisted of the emission which is directed upward from the top surface thereof. However, it has been found through the experiments conducted by the present inventors that there is a fairly large amount of emission which is directed to a lateral direction. FIG. 2 illustrates a graph of characteristics indicating this fact.

Specifically, FIG. 2 shows the results obtained from the measurement wherein four blue emitting LED chips were positioned at apexes of a square and an electric current of 20 mA was permitted to flow to these LED chips under the condition where phosphors are sealed with silicone resin containing no phosphor, thus enabling light to be emitted from these LED chips, the intensity of the resultant light being measured at various angles of right and left from the line extending perpendicularly from the center of the square, which is defined as 0°. Incidentally, in FIG. 2, the intensity of emission was shown by a relative value where 0° was defined as 100.

It will be seen from the graph of characteristics of FIG. 2 that even at a position located laterally at an angle of 60°, it was possible to obtain a fairly large intensity of 75.

Based on these facts, it has been found out by the present inventors that when the light emitting surface of LED chips was covered by a second fluorescent layer containing only an inorganic phosphor which was inherently hardly deteriorated and, at the same time, a first fluorescent layer containing an organic phosphor which was inherently easily deteriorated was disposed on at least the side (preferably, not only the side but also the top surface) of the LED chips with the second fluorescent layer being interposed therebetween and without the first fluorescent layer being contacted with the light emitting surface of the LED chips, it was possible to prevent the deterioration of the organic phosphor, to secure a sufficient lifetime of the light emitting element and to achieve a sufficient emission intensity, thus accomplishing the present invention.

Further, according to the present invention, it is also possible to obtain the following effects. Namely, an inorganic phosphor is generally granular, so that when a fluorescent layer containing an inorganic phosphor is formed thick, the concentration of the inorganic phosphor is caused to become thinner at a supernatant portion of the fluorescent layer due to the sedimentation of the inorganic phosphor, thus frequently deteriorating the intensity of emission at this supernatant portion. Whereas in the case of the present invention, if the fluorescent layer containing an inorganic phosphor is not to be formed thick from the beginning, a redundant portion (corresponding to the side(s) of light emitting element) corresponding to the conventional supernatant portion can be replaced by a fluorescent layer containing an organic phosphor, so that it is possible to prominently increase the intensity of emission since it is possible to obtain a sufficient intensity of emission even from the side(s) of the light emitting element as explained above. Further, while the fluorescent layer containing a granular inorganic phosphor may scatter incident light, the fluorescent layer containing an organic phosphor is transparent and does not scatter incident light, so that when a fluorescent layer containing an inorganic phosphor is formed not so thick on the side(s) of the light emitting element as described above, it is possible to enable the fluorescent layer containing an organic phosphor to emit efficiently while preventing the scattering of light.

Figure 3A:
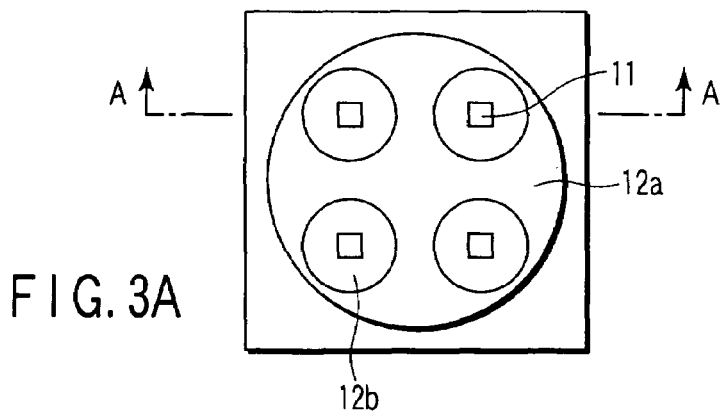
FIGS. 3A and 3B are a top plan view and a cross-sectional view taken along the line A-A of FIG. 3A, respectively, both illustrating the lighting device according to a first embodiment of the present invention.
Figure 3B:
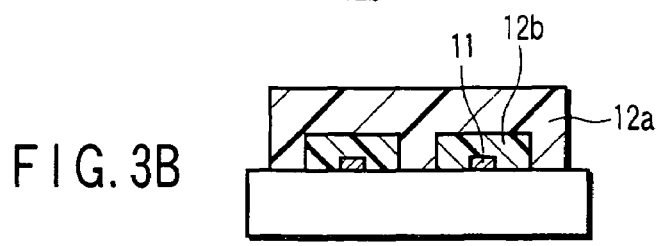

FIGS. 3A and 3B schematically illustrate a lighting device according to a first embodiment of the present invention, wherein FIG. 3A is a top plan view thereof and FIG. 3B is a cross-sectional view taken along the line A-A of FIG. 3A. In the case of the lighting device shown in FIGS. 3A and 3B, the fluorescent layer is constituted by two different kinds of regions, i.e. a first fluorescent layer 12a containing an organic phosphor, and a second fluorescent layer 12b containing only an inorganic phosphor. Four LED chips 11 formed on a substrate 10 are individually covered by the second fluorescent layer 12b, and these four second fluorescent layers 12b are covered by one contiguous first fluorescent layer 12a.

In the case of this arrangement of the first fluorescent layer 12a and the second fluorescent layer 12b, although the second fluorescent layer 12b containing only an inorganic phosphor covers the entire light emitting surface of LED chips 11, the first fluorescent layer 12a containing an organic phosphor is disposed to face the top and side surfaces both constituting the light emitting surface of LED chips 11 with the second fluorescent layer 12b being interposed therebetween and without the first fluorescent layer 12a being directly contacted with the LED chips 11. Therefore, the first fluorescent layer 12a containing an organic phosphor is prevented from being deteriorated and enabled to receive a sufficient intensity of light from the top and side surfaces both constituting the light emitting surface of LED chips 11, thus making it possible to obtain a high spectrum intensity. As a result, it is possible to obtain a lighting device which is excellent in color rendering properties and long in lifetime.

FIGS. 4A and 4B schematically illustrate a lighting device according to a second embodiment of the present invention, wherein FIG. 4A is a top plan view thereof and FIG. 4B is a cross-sectional view taken along the line B-B of FIG. 4A. In the case of the lighting device shown in FIGS. 4A and 4B, four LED chips 11 formed on a substrate 10 are separated into two groups each consisted of two LED chips and these two groups of LED chips are respectively covered by the second fluorescent layer 12b, and these two second fluorescent layers 12b are covered by one contiguous first fluorescent layer 12a.

In the case of this arrangement of the first fluorescent layer 12a and the second fluorescent layer 12b, although the second fluorescent layer 12b containing only an inorganic phosphor covers all over the light emitting surface of LED chips 11, the first fluorescent layer 12a containing an organic phosphor is disposed to face the top and side surfaces both constituting the light emitting surface of LED chips 11 with the second fluorescent layer 12b being interposed therebetween and without the first fluorescent layer 12a being directly contacted with the LED chips 11.

Even with this arrangement of the first fluorescent layer 12a and the second fluorescent layer 12b, it is possible, as in the case of the arrangement shown in FIGS. 3A and 3B, to obtain a lighting device which is excellent in color rendering properties and long in lifetime.

Incidentally, since the second fluorescent layer 12b tends to exhibit high elasticity, the second fluorescent layer 12b may be caused to deform in the arrangement shown in FIGS. 3A and 3B where the second fluorescent layer 12b is separately applied to each of the LED chips 11. As a result, a problem that the lead wire connected with the LED chip 11 may be damaged arises. Whereas, in the case where the second fluorescent layer 12b is formed to bridge a couple of LED chips 11 as shown in FIG. 4A, the second fluorescent layer 12b can be hardly deformed, thus effectively suppressing possibilities of damaging the lead wire.

FIG. 5 schematically illustrates a top plan view of the lighting device according to a third embodiment of the present invention. In the case of the lighting device shown in FIG. 5, four LED chips 11 formed on a substrate 10 are all covered by a single annular pattern of the second fluorescent layer 12b, and this second fluorescent layer 12b is covered by one contiguous first fluorescent layer 12a. The first fluorescent layer 12a extends from the central portion of annular second fluorescent layer 12b, via the top surface thereof, to the peripheral portion of annular second fluorescent layer 12b, thus covering the periphery of annular second fluorescent layer 12b.

In the case of this arrangement of the first fluorescent layer 12a and the second fluorescent layer 12b, although the second fluorescent layer 12b containing only an inorganic phosphor covers the entire light emitting surface of LED chips 11, the first fluorescent layer 12a containing an organic phosphor is disposed to face the top and side surfaces both constituting the light emitting surface of LED chips 11 with the second fluorescent layer 12b being interposed therebetween and without the first fluorescent layer 12a being directly contacted with the LED chips 11.

Even with this arrangement of the first fluorescent layer 12a and the second fluorescent layer 12b, it is possible, as in the case of the arrangement shown in FIGS. 3A and 3B, to obtain a lighting device which is excellent in color rendering properties and long in lifetime. Further, as compared with the arrangement shown in FIGS. 4A and 4B, the second fluorescent layer 12b is made much more difficult to deform, so that the damage of the lead wire can be much more effectively inhibited.

FIG. 6 illustrates a top plan view of the lighting device according to a fourth embodiment of the present invention. The lighting device shown in FIG. 6 is constructed in the same manner as the lighting device of the third embodiment of the present invention shown in FIG. 5 except that the central portion thereof is octagonal (polygonal) in configuration.

FIG. 7 illustrates a top plan view of the lighting device according to a fifth embodiment of the present invention. The lighting device shown in FIG. 7 is constructed in the same manner as the lighting device of the fourth embodiment of the present invention shown in FIG. 6 except that rectangular LED chips 11 formed on the substrate 10 are arrayed to face the center of the lighting device. In this arrangement of LED chips 11, the emission of light from the lateral portion of each of the LED chips 11 is converged to the center of the lighting device, thus making it possible to obtain a more effective emission of light.

Figure 8A:
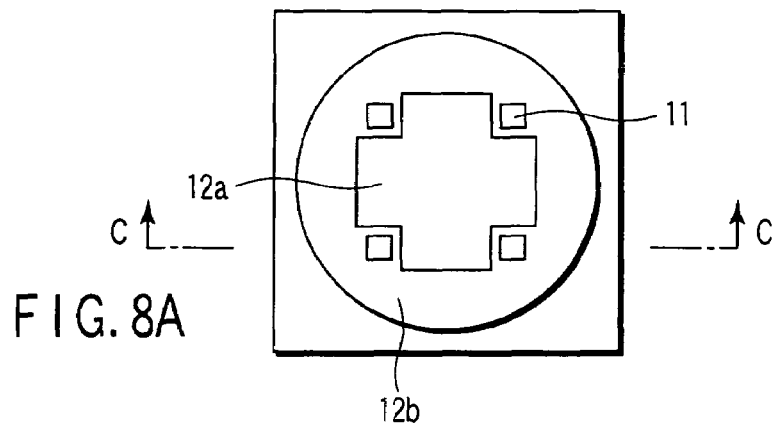
FIGS. 8A and 8B are a top plan view and a cross-sectional view taken along the line C-C of FIG. 8A, respectively, both illustrating the lighting device according to a sixth embodiment of the present invention.
Figure 8B:
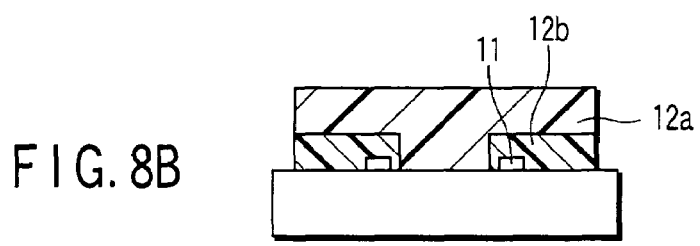

FIGS. 8A and 8B schematically illustrate a lighting device according to a sixth embodiment of the present invention, wherein FIG. 8A is a top plan view thereof and FIG. 8B is a cross-sectional view taken along the line C-C of FIG. 8A. In the case of the lighting device shown in FIGS. 8A and 8B, an annular second fluorescent layer 12b having four corners extended inward to create angular portions is disposed to cover four LED chips 11 positioned at the apexes of square on a substrate 10. The first fluorescent layer 12a configured to extend in four directions between a pair of neighboring LED chips 11 is disposed on the inside of the second fluorescent layer 12b, thereby covering a region extending from the inner sidewall to the top surface of the second fluorescent layer 12b.

In the case of this arrangement of the first fluorescent layer 12a and the second fluorescent layer 12b, since the boundary between the first fluorescent layer 12a and the second fluorescent layer 12b is formed so as to conform to the rectangular configuration of LED chips 11, it is possible to obtain a uniform emission of light.

Figure 10:
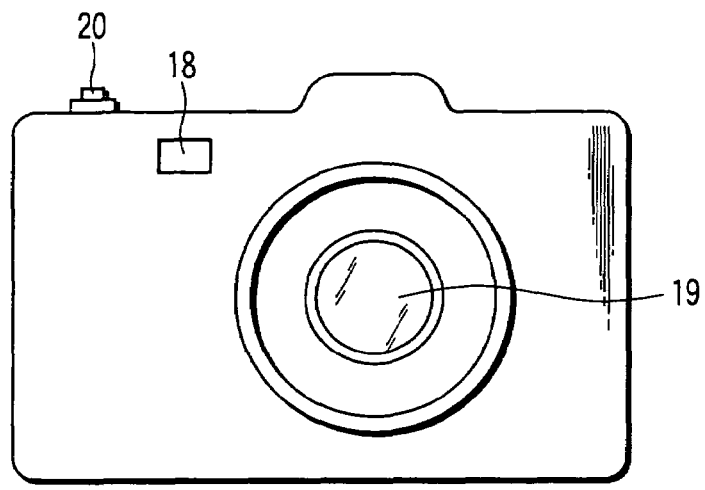
FIG. 10 shows the construction of a camera provided, as a flashing unit, with the lighting device of the present invention.

FIG. 10 shows the construction of a camera provided, as a flashing unit, with each of the aforementioned lighting devices. In the camera shown in FIG. 10, an image pickup element (such as a CCD element) provided with a lens 19 is constructed such that a flashing unit 18 is disposed at an obliquely upper portion over the lens 19 and a shutter release 20 is disposed on one side of the flashing unit 18.

Figure 11:
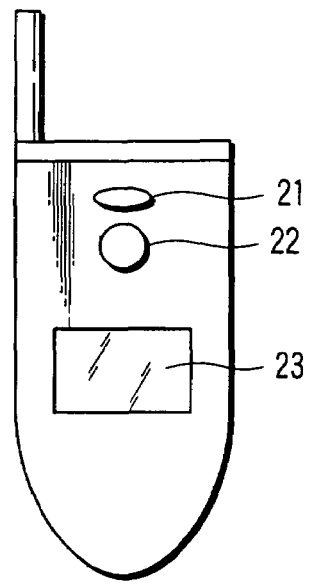
FIG. 11 shows the construction of a portable telephone integrally equipped with a camera provided, as a flashing unit, with the lighting device of the present invention.

FIG. 11 shows the construction of a portable terminal unit such as a portable telephone which is integrally equipped with a camera provided, as a flashing unit, with each of the foregoing lighting devices. In the case of the portable telephone shown in FIG. 11, a portable flashing unit 21 is disposed at an upper portion of camera 22, and a supplemental display screen 23 is disposed at a lower portion of camera 22.

As for the LED chip 11 to be employed in the lighting device according each of the embodiments of the present invention as explained above, it is preferable to employ those which are capable of emitting a light having an emission wavelength ranging from the ultraviolet region to blue region. However, no one has succeeded in discovering an inorganic red phosphor which is capable of emitting light at a high efficiency by making use of the light of these regions.

It has been already found out by the present inventors that a red phosphor consisting of an europium complex having, as a ligand, β-diketone and phosphine oxide is excellent in emission efficiency to the emission of the LED chip ranging from ultraviolet region to the blue region.

Figure 9:
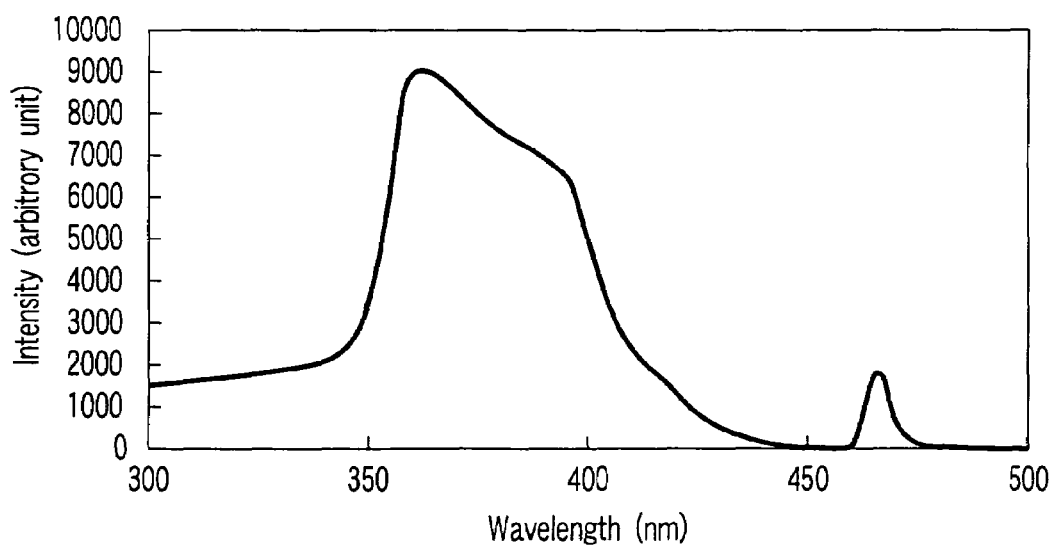
FIG. 9 is a graph showing an excitation spectrum of europium complex having, as a ligand, phosphine oxide and β-diketone.

Namely, as for the red phosphor to be employed in the lighting devices according to each of the foregoing embodiments of the present invention, it is preferable to employ a trivalent europium complex which is stable in the color of emission and high in intensity of emission. In particular, a europium complex containing, as a ligand, phosphine oxide and β-diketone is excellent in dispersibility to a resin and in absorption efficiency of ultraviolet rays, near ultraviolet rays, bluish violet light and blue light, thus making it possible to easily obtain a high emission intensity. FIG. 9 shows an excitation spectrum (excited at 615 nm) of the europium complex of this kind. It will be seen from the excitation spectrum shown in FIG. 9 that an europium complex containing, as a ligand, phosphine oxide and β-diketone is capable of being excited by any of ultraviolet rays, near ultraviolet rays, bluish violet light and blue light.

Among these europium complexes, those containing two kinds of phosphine oxide differing in molecular structure from each other as a ligand are especially desirable since they are excellent in resin dispersibility and light absorption efficiency. The europium complexes of this kind may have a structure shown in the aforementioned formula (1).

Alternatively, the europium complex may be selected from those where two different kinds of phosphine oxide are knotted together forming asymmetric diphosphine oxide as shown in the foregoing formula (2).

Incidentally, as for the matrix for dispersing the phosphor to be employed in the lighting device according to the embodiments of the present invention, it is preferable to employ fluorinated polymer or polysiloxane, since these polymers are excellent in transparency and durability.

Next, the effects to be obtained by the present invention will be more specifically explained with reference to the following examples and comparative example.

EXAMPLE 1

A first fluorescent layer 12a containing 50wt % of a red phosphor represented by the following formula (3) and dispersed in Ceflural (trade name, Central Chemicals Co., Ltd.; fluorinated polymer), and a second fluorescent layer 12b containing 30wt % of nonYAG (yttrium, aluminum and garnet)-based phosphor dispersed as a yellow phosphor in silicone polymer were disposed as shown in FIG. 3 to manufacture a lighting device shown in FIG. 3.

The maximum wavelength of an LED chip 11 employed in this lighting device was 470 nm. When this lighting device was actuated so as to enable an electric current of 20 mA to flow to one of the LED devices 11, the luminous intensity thereof was 5.0 cd, the general color rendering index was 80, and luminosity half life the luminosity half life was 30000 hours, all indicating excellent results.

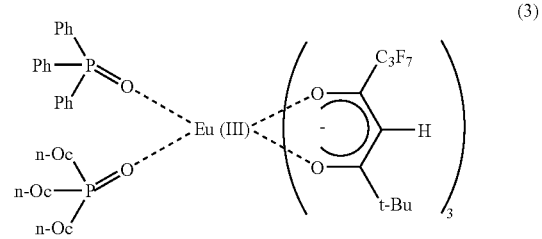

(3)

EXAMPLE 2

A lighting device was manufactured in the same manner as that of Example 1 excepting that a red phosphor (n=3) shown in the following formula (4) was employed.

The maximum wavelength of an LED chip 11 employed in this lighting device was 470 nm. When this lighting device was actuated so as to enable an electric current of 20 mA to flow to one of the LED devices 11, the luminous intensity thereof was 4.9 cd, the general color rendering index was 80 and the luminosity half life was 35000 hours, all indicating excellent performance.

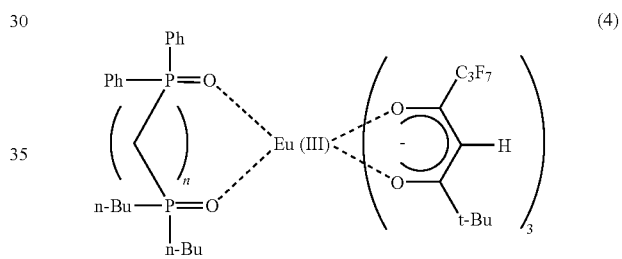

(4)

EXAMPLE 3

A lighting device was manufactured in the same manner as in Example 1 except that the first phosphor layer 12a and the second phosphor layer 12b were disposed as shown in FIGS. 4A and 4B.

The maximum wavelength of an LED chip 11 employed in this lighting device was 470 nm. When this lighting device was actuated so as to enable an electric current of 20 mA to flow to one of the LED devices 11, the luminous intensity thereof was 4.9 cd, the general color rendering index was 85 and the luminosity half life was 35000 hours, all indicating excellent performance.

EXAMPLE 4

A lighting device was manufactured in the same manner as in Example 1 except that the first phosphor layer 12a and the second phosphor layer 12b were disposed as shown in FIG. 5.

The maximum wavelength of an LED chip 11 employed in this lighting device was 470 nm. When this lighting device was actuated so as to enable an electric current of 20 mA to flow to one of the LED devices 11, the luminous intensity thereof was 5.2 cd, the general color rendering index was 85 and the luminosity half life was 35000 hours, all indicating excellent performance.

EXAMPLE 5

A lighting device was manufactured in the same manner as in Example 1 except that the first phosphor layer 12a and the second phosphor layer 12b were disposed as shown in FIG. 6.

The maximum wavelength of an LED chip 11 employed in this lighting device was 470 nm. When this lighting device was actuated so as to enable an electric current of 20 mA to flow to one of the LED devices 11, the luminous intensity thereof was 5.2 cd, the general color rendering index was 85 and the luminosity half life was 35000 hours, all indicating excellent performance.

EXAMPLE 6

A lighting device was manufactured in the same manner as in Example 1 except that the first phosphor layer 12a and the second phosphor layer 12b were disposed as shown in FIG. 7.

The maximum wavelength of an LED chip 11 employed in this lighting device was 470 nm. When this lighting device was actuated so as to enable an electric current of 20 mA to flow to one of the LED devices 11, the luminous intensity thereof was 6.0 cd, the general color rendering index was 90 and the luminosity half life was 35000 hours, all indicating excellent performance.

EXAMPLE 7

A lighting device was manufactured in the same manner as in Example 1 except that the first phosphor layer 12a and the second phosphor layer 12b were disposed as shown in FIGS. 8A and 8B.

The maximum wavelength of an LED chip 11 employed in this lighting device was 470 nm. When this lighting device was actuated so as to enable an electric current of 20 mA to flow to one of the LED devices 11, the luminous intensity thereof was 6.0 cd, the general color rendering index was 91 and the luminosity half life was 35000 hours, all indicating excellent performance.

EXAMPLE 8

A lighting device was manufactured in the same manner as in Example 1 except that a second phosphor layer 12b having CaS:Ce dispersed as a yellow phosphor in silicone polymer at a ratio of 40wt % was employed.

The maximum wavelength of an LED chip 11 employed in this lighting device was 470 nm. When this lighting device was actuated so as to enable an electric current of 20 mA to flow to one of the LED devices 11, the luminous intensity thereof was 5.1 cd, the general color rendering index was 85 and the luminosity half life was 30000 hours, all indicating excellent performance.

EXAMPLE 9

A lighting device was manufactured in the same manner as in Example 1 except that a second phosphor layer 12b having an alkaline earth metal silicate phosphor dispersed as a yellow phosphor in silicone polymer at a ratio of 40wt % was employed.

The maximum wavelength of an LED chip 11 employed in this lighting device was 470 nm. When this lighting device was actuated so as to enable an electric current of 20 mA to flow to one of the LED devices 11, the luminous intensity thereof was 6.0 cd, the general color rendering index was 85 and the luminosity half life was 30000 hours, all indicating excellent performance.

EXAMPLE 10

A first fluorescent layer 12a containing 50wt % of a red phosphor represented by the aforementioned formula (3) and dispersed in Ceflural (trade name, Central Chemicals Co., Ltd.; fluorinated polymer), and a second fluorescent layer 12b containing 15wt % of $SrGa_2S_4$:Eu as a green phosphor and YAG-based phosphor dispersed as a yellow phosphor in silicone polymer at a ratio of 30wt % were disposed as shown in FIGS. 3A and 3B to manufacture a lighting device shown in FIGS. 3A and 3B.

The LED chip 11 employed in this lighting device was a near ultraviolet LED chip having a central emission wavelength of 470 nm and the maximum wavelength thereof was 470 nm. When this lighting device was actuated so as to enable an electric current of 20 mA to flow to one of the LED devices 11, the luminous intensity thereof was 6.0 cd, the general color rendering index was 95 and the luminosity half life was 30000 hours, all indicating excellent performance.

As seen from this example, due to the concurrent employment of a yellow phosphor and a green phosphor, it was possible to obtain very excellent color rendering properties and light intensity.

EXAMPLE 11

A first fluorescent layer 12a containing 50wt % of a red phosphor represented by the following formula (3) and dispersed in Ceflural (trade name, Central Chemicals Co., Ltd.; fluorinated polymer), and a second fluorescent layer 12b containing 50wt % of $SrGa_2S_4$:Eu as a green phosphor were disposed as shown in FIGS. 3A and 3B to manufacture a lighting device shown in FIGS. 3A and 3B.

The LED chip 11 employed in this lighting device was a near ultraviolet LED chip having a central emission wavelength of 470 nm and the maximum wavelength thereof was 470 nm. When this lighting device was actuated so as to enable an electric current of 20 mA to flow to one of the LED devices 11, the luminous intensity thereof was 5.0 cd, the general color rendering index was 95 and the luminosity half life was 30000 hours, all indicating excellent performance.

EXAMPLE 12

A first fluorescent layer 12a containing 50wt % of a red phosphor represented by the aforementioned formula (3) and dispersed in Ceflural (trade name, Central Chemicals Co., Ltd.; fluorinated polymer), and a second fluorescent layer 12b containing 30wt % of $SrGa_2S_4$:Eu as a green phosphor and BAM:Eu dispersed as a blue phosphor in silicone polymer at a ratio of 30wt % were disposed as shown in FIGS. 3A and 3B to manufacture a lighting device shown in FIGS. 3A and 3B.

The LED chip 11 employed in this lighting device was a near ultraviolet LED chip having a central emission wavelength of 405 nm. When this lighting device was actuated so as to enable an electric current of 20 mA to flow to one of the LED devices 11, the luminous intensity thereof was 4.0 cd, the general color rendering index was 95 and the luminosity half life was 30000 hours, all indicating excellent performance.

EXAMPLE 13

A lighting device was manufactured in the same manner as in Example 11 except that a near ultraviolet LED chip having a central emission wavelength of 380 nm was employed as an LED chip 11.

When this lighting device was actuated so as to enable an electric current of 20 mA to flow to one of the LED devices 11, the luminous intensity thereof was 4.5 cd, the general color rendering index was 95 and the luminosity half life was 30000 hours, all indicating excellent performance.

COMPARATIVE EXAMPLE 1

A lighting device was manufactured in the same manner as in Example 1 except that a fluorescent layer consisted of a mixture composed of the same kind of red emitting phosphor and the same kind of yellow emitting phosphor as employed in Example 1 was employed in place of the first phosphor layer 12a and the second phosphor layer 12b.

When this lighting device was actuated so as to enable an electric current of 20 mA to flow to one of the LED devices 11, the luminous intensity was 4.9 cd, a general color rendering index was 80, indicating excellent properties. However, the luminosity half life was only 170 hours, indicating very inferior performance.

Incidentally, the present invention should not be construed as being limited to the aforementioned embodiments and examples. For example, the fluorescent layer containing an organic phosphor may be disposed between a plurality of light emitting elements or only around the periphery of light emitting elements. Alternatively, the fluorescent layer may be disposed not only between a plurality of light emitting elements but also around the periphery of light emitting elements. Further, although the intensity of light may be deteriorated more or less, the fluorescent layer containing an organic phosphor may be disposed only around the periphery and on the top surface of the plurality of light emitting elements. Further, in the case where the fluorescent layer containing an inorganic phosphor is an annular film, the phosphor layer containing an organic phosphor may be disposed inside or outside of the annular film, or on both the inside and outside of the annular film. Although the intensity of light may be deteriorated more or less, the fluorescent layer containing an organic phosphor may be disposed on the periphery and top surface of the annular film. Further, although it is preferable to employ a plurality of light emitting elements, it is also possible to employ only one light emitting element.

Figure 12A:
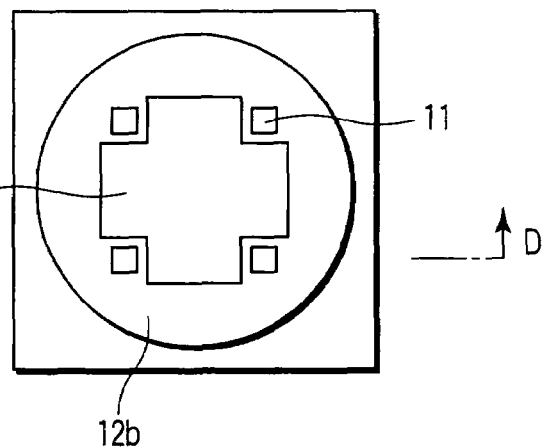
FIGS. 12A and 12B are a top plan view and a cross-sectional view taken along the line D-D of FIG. 12A, respectively, both illustrating the lighting device according to a modified embodiment of the present invention.
Figure 12B:
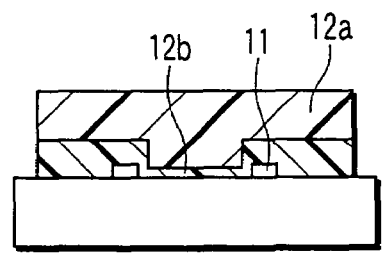

Moreover, as shown in FIGS. 12A and 12B, the lighting device may be constructed in such a manner that an fluorescent layer 12b containing an inorganic phosphor is deposited as a thin layer at a region between a plurality of light emitting elements 11, and a phosphor layer 12a containing an organic phosphor is deposited on the fluorescent layer 12b. Incidentally, FIG. 12A is a top plan view and FIG. 12B is a cross-sectional view taken along the line D-D of FIG. 12A. In this case also, since the phosphor layer 12a containing an organic phosphor is disposed on one side of the light emitting element 11, it is possible to obtain almost the same effects as obtained in the foregoing embodiments.

The present invention should not be construed as being limited to the aforementioned embodiments, but may be variously modified in the practical use thereof through the modification of the constituent elements of the present invention without departing from the spirit or scope of the invention. Further, a plurality of constituent elements disclosed in the foregoing embodiments may be suitably combined to create various inventions. For example, one or some of the constituent components may be removed from the entire constituent elements shown in the embodiments. Further, the constituent elements shown in different embodiments may be suitably combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lighting device comprising:
    a supporting member;
    a plurality of light emitting element disposed on the supporting member, and each emitting light from an upper and side surfaces thereof;
    a first fluorescent layer containing an organic phosphor and disposed on the supporting member; and
    a second fluorescent layer containing only an inorganic phosphor and disposed on the upper surface of the supporting member;
    wherein the second fluorescent layer is disposed to cover the upper and side surfaces of the light emitting element, and the first fluorescent layer is disposed on at least side surface of the light emitting element with the second fluorescent layer being interposed between the light emitting element and the first fluorescent layer,
    wherein the organic phosphor is a trivalent europium complex,
    wherein the europium complex has a structure represented by the following formula (2):

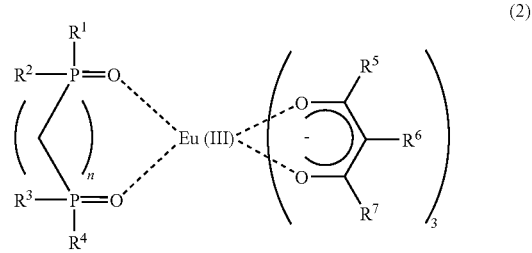

(2)

wherein $R^1$-$R^7$ are individually selected from the group consisting of a linear or branched alkyl or alkoxy group each having not more than 20 carbon atoms, phenyl group, biphenyl group, naphthyl group, heterocyclic group, substitution products of foregoing groups, hydrogen atom and deuterium atom with a proviso that all of $R^1$-$R^4$ are not the same with each other; and n is an integer of 2 or more.

2. The lighting device according to claim 1, wherein the first fluorescent layer is disposed between the plurality of light emitting elements.

3. The lighting device according to claim 1, wherein the second fluorescent layer includes a plurality of portions corresponding to the plurality of the light emitting elements, the plurality of portions being separated away from each other, each covering the upper and side surfaces of each of the light emitting elements, and the first fluorescent layer is disposed between the plurality of the light emitting elements.

4. The lighting device according to claim 2, wherein the plurality of light emitting elements are disposed in an annular pattern on the supporting member, the second fluorescent layer is an annular film disposed to cover the annular pattern of the light emitting element, and the first fluorescent layer is disposed to cover at least a region inside the annular pattern of the light emitting elements.

5. The lighting device according to claim 2, wherein the plurality of light emitting elements are disposed in an annular pattern on the supporting member, the second fluorescent layer is an annular film disposed to cover the annular pattern of the light emitting element, and the first fluorescent layer is disposed to cover region inside the annular pattern and an upper surface of the second fluorescent layer.

6. The lighting device according to claim 2, wherein the plurality of light emitting elements are disposed in an annular pattern on the supporting member, the second fluorescent layer is an annular film disposed to cover the annular pattern of the light emitting element, and the first fluorescent layer is disposed to cover regions inside and outside the annular pattern and an upper surface of the second fluorescent layer.

7. The lighting device according to claim 2, wherein the plurality of light emitting elements are approximately rectangular in configuration and disposed in an annular pattern, one light emitting side surface of each of the light emitting elements being directed to face a center of the annular pattern.

8. The lighting device according to claim 2, wherein the plurality of light emitting elements are all capable of emitting one kind of light selected from the group consisting of ultraviolet ray, near ultraviolet ray, bluish violet light and blue light, and all of the light emitting elements are designed to be driven by a single power source.

9. The lighting device according to claim 3, wherein the plurality of light emitting elements are all capable of emitting one kind of light selected from the group consisting of ultraviolet ray, near ultraviolet ray, bluish violet light and blue light, and all of the light emitting elements are designed to be driven by a single power source.

10. The lighting device according to claim 1, wherein the organic phosphor is capable of emitting red light.

11. The lighting device according to claim 1, wherein the organic phosphor is a red phosphor formed of the trivalent europium complex containing, as a ligand, at least one kind of β-diketone and at least one kind of phosphine oxide.

12. The lighting device according to claim 1, wherein the europium complex is coordinated with two different kinds of phosphine oxide structure.

13. An image pickup apparatus comprising: an image pickup element; and a lighting device integrally mounted on the image pickup element and acting as illumination on an occasion of taking a photograph;

the lighting device including:

a supporting member;

a plurality of light emitting element disposed on the supporting member, and each emitting light from an upper and side surfaces thereof;

a first fluorescent layer containing an organic phosphor and disposed on the supporting member; and a second fluorescent layer containing only an inorganic phosphor and disposed on the supporting member;

wherein the second fluorescent layer is disposed to cover the upper and side surfaces of the light emitting element, and the first fluorescent layer is disposed on at least side surface of the light emitting elements with the second fluorescent layer being interposed between the light emitting element and the first fluorescent layer, wherein the organic phosphor is a trivalent europium complex, wherein the europium complex has a structure represented by the following formula (2):

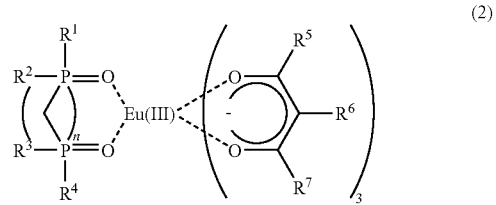

wherein $R^1$-$R^7$ are individually selected from the group consisting of a linear or branched alkyl or alkoxy group each having not more than 20 carbon atoms, phenyl group, biphenyl group, naphthyl group, heterocyclic group, substitution products of foregoing groups, hydrogen atom and deuterium atom with a proviso that all of $R^1$-$R^4$ are not the same with each other; and n is an integer of 2 or more.

14. The image pickup apparatus according to claim 13, wherein the first fluorescent layer is disposed between the plurality of light emitting elements.

15. The image pickup apparatus according to claim 13, wherein the second fluorescent layer includes a plurality of portions corresponding to the plurality of the light emitting elements, the plurality of portions being separated away from each other, each covering the upper and side surfaces of each of the light emitting elements, and the first fluorescent layer is disposed between the plurality of the light emitting elements.

16. The image pickup apparatus according to claim 13, wherein the organic phosphor is a red phosphor formed of the trivalent europium complex containing, as a ligand, at least one kind of β-diketone and at least one kind of phosphine oxide.

17. A portable terminal unit comprising: an image pickup element; and a lighting device integrally mounted on the image pickup element and acting as illumination on an occasion of taking a photograph;

the lighting device including:

a supporting member;

a plurality of light emitting element disposed on the supporting member, and each emitting light from an upper and side surfaces thereof;

a first fluorescent layer containing an organic phosphor and disposed on the supporting member; and a second fluorescent layer containing only an inorganic phosphor and disposed on the supporting member;

wherein the second fluorescent layer is disposed to cover the upper and side surfaces of the light emitting element, and the first fluorescent layer is disposed on at least side surface of the light emitting element with the second fluorescent layer being interposed between the light emitting element and the first fluorescent layer, wherein the organic phosphor is a trivalent europium complex, wherein the europium complex has a structure represented by the following formula (2):

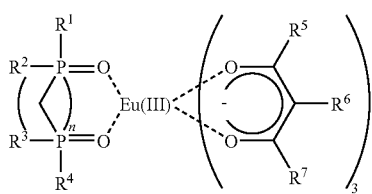 (2)

wherein $R^1$-$R^7$ are individually selected from the group consisting of a linear or branched alkyl or alkoxy group each having not more than 20 carbon atoms, phenyl group, biphenyl group, naphthyl group, heterocyclic group, substitution products of foregoing groups, hydrogen atom and deuterium atom with a proviso that all of $R^1$-$R^4$ are not the same with each other; and n is an integer of 2 or more.

18. The portable terminal unit according to claim 17, wherein the first fluorescent layer is disposed between the plurality of light emitting elements.

19. The portable terminal unit according to claim 17, wherein the second fluorescent layer includes a plurality of portions corresponding to the plurality of the light emitting elements, the plurality of portions being separated away from each other, each covering the upper and side surfaces of each of the light emitting elements, and the first fluorescent layer is disposed between the plurality of the light emitting elements.

* * * * *